US009124062B2

(12) United States Patent
Wunderer et al.

(10) Patent No.: US 9,124,062 B2
(45) Date of Patent: Sep. 1, 2015

(54) OPTICALLY PUMPED SURFACE EMITTING LASERS INCORPORATING HIGH REFLECTIVITY/BANDWIDTH LIMITED REFLECTOR

(75) Inventors: Thomas Wunderer, Palo Alto, CA (US); John E. Northrup, Palo Alto, CA (US); Mark R. Teepe, Menlo Park, CA (US); Noble M. Johnson, Menlo Park, CA (US)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 415 days.

(21) Appl. No.: 13/427,335

(22) Filed: Mar. 22, 2012

(65) Prior Publication Data

US 2013/0250986 A1    Sep. 26, 2013

(51) Int. Cl.
| H01S 5/024 | (2006.01) |
| H01S 5/14 | (2006.01) |
| H01S 5/183 | (2006.01) |
| H01S 5/04 | (2006.01) |
| H01S 5/343 | (2006.01) |
| H01S 3/109 | (2006.01) |
| H01S 5/00 | (2006.01) |

(52) U.S. Cl.
CPC ............ *H01S 5/02461* (2013.01); *H01S 5/141* (2013.01); *H01S 5/18361* (2013.01); *H01S 5/18366* (2013.01); *H01S 3/109* (2013.01); *H01S 5/0092* (2013.01); *H01S 5/02469* (2013.01); *H01S 5/041* (2013.01); *H01S 5/18369* (2013.01); *H01S 5/34333* (2013.01)

(58) Field of Classification Search
CPC .............. H01S 5/02461; H01S 5/0092; H01S 5/02469; H01S 5/041; H01S 5/141; H01S 5/18361; H01S 5/18366; H01S 5/34333; H01S 3/109; H01S 5/18369; H01S 5/183
See application file for complete search history.

(56) References Cited

U.S. PATENT DOCUMENTS

| 4,730,334 A | 3/1988 | Collins et al. |
| 5,461,637 A | 10/1995 | Mooradian et al. |
| 5,561,680 A | 10/1996 | Haberern et al. |
| 5,677,923 A | 10/1997 | Rice et al. |
| 5,706,306 A * | 1/1998 | Jiang et al. ..................... 372/96 |
| 5,771,253 A | 6/1998 | Chang-Hasnain et al. |
| 6,393,038 B1 | 5/2002 | Raymond et al. |
| 6,556,602 B2 | 4/2003 | Rice et al. |
| 6,611,544 B1 * | 8/2003 | Jiang et al. ................ 372/50.11 |
| 6,611,546 B1 | 8/2003 | Garnache et al. |

(Continued)

FOREIGN PATENT DOCUMENTS

| EP | 1208622 | 5/2003 |
| EP | 1720225 | 11/2006 |

(Continued)

OTHER PUBLICATIONS

Rao et al., "Multiwavelength HCG-VCSEL Array", IEEE, 2010, pp. 11-12.

(Continued)

*Primary Examiner* — Xinning Niu
(74) *Attorney, Agent, or Firm* — Hollingsworth Davis, LLC

(57) ABSTRACT

Optically pumped laser structures incorporate reflectors that have high reflectivity and are bandwidth limited to a relatively narrow band around the central laser radiation wavelength. In some cases, the reflectors may be ¾-wavelength distributed Bragg reflectors (DBRs).

22 Claims, 13 Drawing Sheets

(56) References Cited

U.S. PATENT DOCUMENTS

| | | | |
|---|---|---|---|
| 6,735,234 | B1 | 5/2004 | Paschotta et al. |
| 6,775,314 | B1 | 8/2004 | Waldrip et al. |
| 6,778,582 | B1 | 8/2004 | Mooradian |
| 6,879,618 | B2 | 4/2005 | Cok et al. |
| 6,882,669 | B2* | 4/2005 | Hang et al. .............. 372/43.01 |
| 7,167,495 | B2 | 1/2007 | Johnson |
| 7,471,854 | B2 | 12/2008 | Cho et al. |
| 7,573,920 | B2 | 8/2009 | Lee et al. |
| 7,590,161 | B1 | 9/2009 | Hug et al. |
| 7,613,215 | B2 | 11/2009 | Kim |
| 7,733,936 | B2 | 6/2010 | Okamoto |
| 7,856,043 | B2 | 12/2010 | Kim et al. |
| 8,000,371 | B2 | 8/2011 | Strittmatter et al. |
| 8,102,893 | B2 | 1/2012 | Giaretta et al. |
| 8,121,169 | B2 | 2/2012 | Nguyen et al. |
| 2003/0031218 | A1 | 2/2003 | Yeh |
| 2003/0081642 | A1* | 5/2003 | Hwang et al. .............. 372/45 |
| 2003/0214992 | A1* | 11/2003 | Lester et al. .............. 372/50 |
| 2004/0013154 | A1 | 1/2004 | Zheng |
| 2004/0233961 | A1 | 11/2004 | Lutgen |
| 2005/0100074 | A1 | 5/2005 | Okazaki et al. |
| 2005/0135450 | A1* | 6/2005 | Katsuyama et al. .............. 372/50 |
| 2005/0232327 | A1 | 10/2005 | Nomura et al. |
| 2005/0281309 | A1 | 12/2005 | Kim |
| 2006/0029112 | A1* | 2/2006 | Young et al. .............. 372/7 |
| 2006/0029120 | A1 | 2/2006 | Mooradian et al. |
| 2006/0140235 | A1* | 6/2006 | Kim .............. 372/45.01 |
| 2007/0009000 | A1 | 1/2007 | Tanaka et al. |
| 2007/0274361 | A1* | 11/2007 | Calvez et al. .............. 372/50.1 |
| 2008/0117946 | A1* | 5/2008 | Kim .............. 372/50.11 |
| 2008/0192784 | A1 | 8/2008 | Brick |
| 2009/0207873 | A1 | 8/2009 | Jansen |
| 2009/0232179 | A1 | 9/2009 | Ikuta |
| 2009/0296752 | A1 | 12/2009 | Giaretta et al. |
| 2010/0150193 | A1 | 6/2010 | Bhat et al. |
| 2010/0260215 | A1 | 10/2010 | Nguyen et al. |
| 2011/0182312 | A1 | 7/2011 | Chen et al. |
| 2011/0216789 | A1 | 9/2011 | Docter et al. |
| 2011/0268143 | A1 | 11/2011 | Strittmatter et al. |
| 2013/0163627 | A1 | 6/2013 | Seurin et al. |

FOREIGN PATENT DOCUMENTS

| | | |
|---|---|---|
| EP | 1648060 | 7/2008 |
| WO | WO03007437 | 1/2003 |
| WO | WO2006074011 | 7/2006 |
| WO | WO2007144471 | 12/2007 |
| WO | WO2009060365 | 5/2009 |

OTHER PUBLICATIONS

Fedler et al., "High Reflectivity AlGaN/AlN DBR Mirrors Grown by PA-MBE", Phys. Stat. Sol. (c) ), No. 1, 2002, pp. 258-262.

Wunderer et al., "In-Well Pumping of InGaN/GaN Vertical-External-Cavity Surface-Emitting Lasers", Appl. Phys. Lett. 99, 201109 (2011), 4 pages.

Amari et al., "Characterization of thickness, elemental distribution and band-gap properties in AlGaN/GaN quantum wells by aberration-corrected TEM/STEM" Journal of Physics: Conference Series 371, 2012, 4 pages.

File History for U.S. Appl. No. 13/427,105.

Search Report dated Jun. 28, 2013 from GB Application No. GB1305193.3, 4 pages.

Search Report dated Jun. 21, 2013 from GB Application No. GB1305179.2, 4 pages.

Gronin et al., "Effective Green Semiconductor Lasers with Multiple CdSe/ZnSe QD Active Region for Electron Beam Pumping", Acta Physica Polonica A vol. 114, No. 5, 2008, 8 pages.

Kozlovsky et al., "E-beam Longitudinally Pumped Laser Based on ZnCdSe/ZnSe MQW Structure Grown by MBE on ZnSe(001) Substrate", Phys. Stat. Sol. (b), vol. 229, No. 2, 2002, pp. 1033-1038.

Kozlovsky et al., "E-beam Longitudinally Pumped Laser on MOVPE-Grown Hexagonal CdSSe/CdS MQW Structure", 10th European Workshop on MOVPE, Lecce, Italy Jun. 8-11, 2003, 4 pages.

Kozlovsky et al., "E-beam Pumped Blue-Green VCSEL Based on ZnCdSe/ZnSe MQW Structure Grown by MBE on ZnSe Substrate", Laser Physics, vol. 8, No. 6, 1998, pp. 1118-1123.

Kozlovsky et al., "Electron-beam Pumped Laser Structures based on MBE Grown ZnCdSe/ZnSe Superlattices", Journal of Crystal Growth, vol. 159, 1996 pp. 609-612.

Krestinokov, "Photopumped InGaN/GaN/AlGaN Vertical Cavity Surface Emitting Laser Operating at Room Temperature", Phys. Stat. sol. (b) 216, 1999 pp. 511-515.

Kuznetsov et al., "Design and Characteristics of High-Power (>0.5-W CW) Diode-Pumped Vertical-External-Cavity Surface-Emitting Semiconductor Lasers with Circular TEM$_{00}$ Beams", IEEE Journal of Selected Topics in Quantum Electronics, vol. 5, No. 3, May/Jun. 1999, pp. 561-573.

Lee et al., "7W High-Efficiency Continuous-Wave Green Light Generation by Intracavity Frequency Doubling of an End-Pumped Vertical External-Cavity Surface Emitting Semiconductor Laser", Applied Physics Letters, 89, 241107, 2006, 6 pages.

Skrobol et al., "A Miniature Electron Beam Pumped Laser", The European Physical Journal D, vol. 54, 2009, pp. 103-109.

Tiberi et al., "Electron Beam Pumped Lasers Based on II-VI Compound Nanostructures from the Visible to UVA", Phys. Status Solidi, vol. 247, No. 6, 2010, pp. 1547-1552.

Vysotsky et al., "Simulation of a Longitudinally Electron-beam-pumped Nanheterostructure Semiconductor Laser", Quantum Electronics, vol. 39, No. 11, 2009, pp. 1028-1032.

Yu et al., "Electron-beam Pumped Blue (462nm) VCSEL on MOVPE-grown ZnSSe/ZnMgSSe MQW Structure", Phys. Stat. Sol. (c) vol. 2, No. 2, 2005, pp. 935-938.

Zverev et al. "Low-threshold Electron-beam-pumped Green Quantum-well Heterostructure Semiconductor Lasers", Quantum Electronics, vol. 34, No. 10, 2004, pp. 909-911.

Sep. 8, 2014, File History for U.S. Appl. No. 13/427,105.

Apr. 14, 2015, File History for U.S. Appl. No. 13/523,681.

* cited by examiner

OPTICALLY PUMPED SURFACE EMITTING LASERS INCORPORATING HIGH REFLECTIVITY/BANDWIDTH LIMITED REFLECTOR

STATEMENT REGARDING FEDERALLY SPONSORED RESEARCH AND DEVELOPMENT

This invention was made with Government support under U.S. Army Cooperative Agreement No. W911NF-10-02-0008 awarded by the U.S. Defense Threat Reduction Agency (DTRA). The Government has certain rights in this invention.

SUMMARY

Embodiments disclosed herein involve optically pumped laser structures incorporating reflectors that have high reflectivity and are reflectivity bandwidth limited to a relatively narrow band around the central laser radiation wavelength.

Some embodiments involve a laser structure that includes a semiconductor gain region configured to emit radiation at a central laser wavelength. An optical pump source is configured to emit a pump radiation beam having a central pump wavelength directed toward the gain region. A first reflector comprising a distributed Bragg reflector (DBR) is disposed in the pump radiation beam, the first reflector having reflectivity greater than about 90% across a bandwidth of less than about 60 nm centered at the central laser wavelength. The first reflector also has a reflectivity less than about 50% at the central pump wavelength. The laser structure includes second reflector, wherein the gain region is disposed between the first reflector and the second reflector.

The first reflector may include a number of layer pairs, each layer pair having a first layer and a second layer, wherein an optical thickness of the first layer is ¾ of the central laser wavelength and an optical thickness of the second layer is ¾ of the central laser wavelength. In some cases the number of layer pairs is greater than about 6.

The first reflector can include alternating layers of non-epitaxial, dielectric materials or alternating layers of epitaxially grown semiconductor materials, for example.

In some implementations, the first reflector may have multiple portions with differing thermal conductivity. A first portion of the first reflector may have a first thermal conductivity and a second portion of the first reflector may have a second thermal conductivity that is less than the first thermal conductivity. For example, the first portion of the first reflector may comprise alternating layers of epitaxially grown semiconductor and the second portion may comprise non-epitaxial, dielectric materials.

According to some aspects, the central pump radiation wavelength is between 370 and 530 nm and the central laser wavelength is in a range of about 390 to about 550 nm. The pump radiation beam can be incident on a surface of the first reflector at an angle with respect to normal to the surface of the first reflector. For example, in some implementations, the angle is about 25 to about 30 degrees or about 35 to about 40 degrees and the first reflector has reflectivity less than about 25% at the pump wavelength of about 405 nm. In some cases, the pump radiation beam is incident on the first reflector at an angle of about 43 degrees and the first reflector has reflectivity less than about 25% at the pump wavelength of about 445 nm.

The laser gain region may comprise InGaN quantum well layers. The second reflector can have a reflectivity greater than 90% for both the peak pump wavelength and the peak laser wavelength.

Some embodiments involve a laser structure including a semiconductor gain region disposed between first and second reflectors and configured to emit radiation at a central laser wavelength. The semiconductor gain region is optically pumped by a pump source configured to emit a pump radiation beam at a central pump wavelength directed toward the gain region. The first reflector comprising a distributed Bragg reflector (DBR) is disposed proximate a heat sink, the first reflector having a thermal conductivity that varies with distance from the heat sink. For example, a first portion of the first reflector has a first thermal conductivity and a second portion of the first reflector has a second thermal conductivity that is lower than the thermal conductivity of the first portion, wherein the first portion is closer to the gain region than the second portion. The first portion may include alternating layers of epitaxially grown semiconductor material and the second portion may comprise alternating layers of non-epitaxial, dielectric materials.

According to some embodiments, a semiconductor gain region having a first side and a second side and configured to emit radiation at a central laser wavelength is disposed between first and second reflectors. A pump source is configured to emit a pump radiation beam at a central pump wavelength directed toward the gain region. The first reflector is a distributed Bragg reflector (DBR) arranged proximate the first side of the gain region and in the pump radiation beam. A reflecting surface is disposed proximate the second side of the gain region with an air gap between the second reflector and the reflecting surface.

Positioning elements can be arranged to adjust a thickness of the air gap. The gap can be selected so that the pump radiation includes multiple modes and the laser radiation has only a single mode. In some cases, the reflecting surface is a surface of a substrate remnant upon which the gain region is epitaxially grown.

Some embodiments involve a method of operating a laser comprising a semiconductor gain region disposed between first and second reflectors. A reflecting surface is disposed proximate to the gain region such that the first and second reflectors define a primary laser cavity and the reflecting surface and the second reflector define a secondary optical cavity. A pump source is operated to optically pump the gain region, the pump source emitting pump radiation having a number of input modes. A gap between the reflecting surface and the second reflector can be adjusted until the laser outputs one or more selected output modes. The gap between the reflecting surface and the second reflector can be adjusted until the laser outputs a number of output modes that is less than the number of input modes. For example, the gap may be adjusted so that the number of output modes is only one.

DESCRIPTION OF VARIOUS EMBODIMENTS

Figure 1:
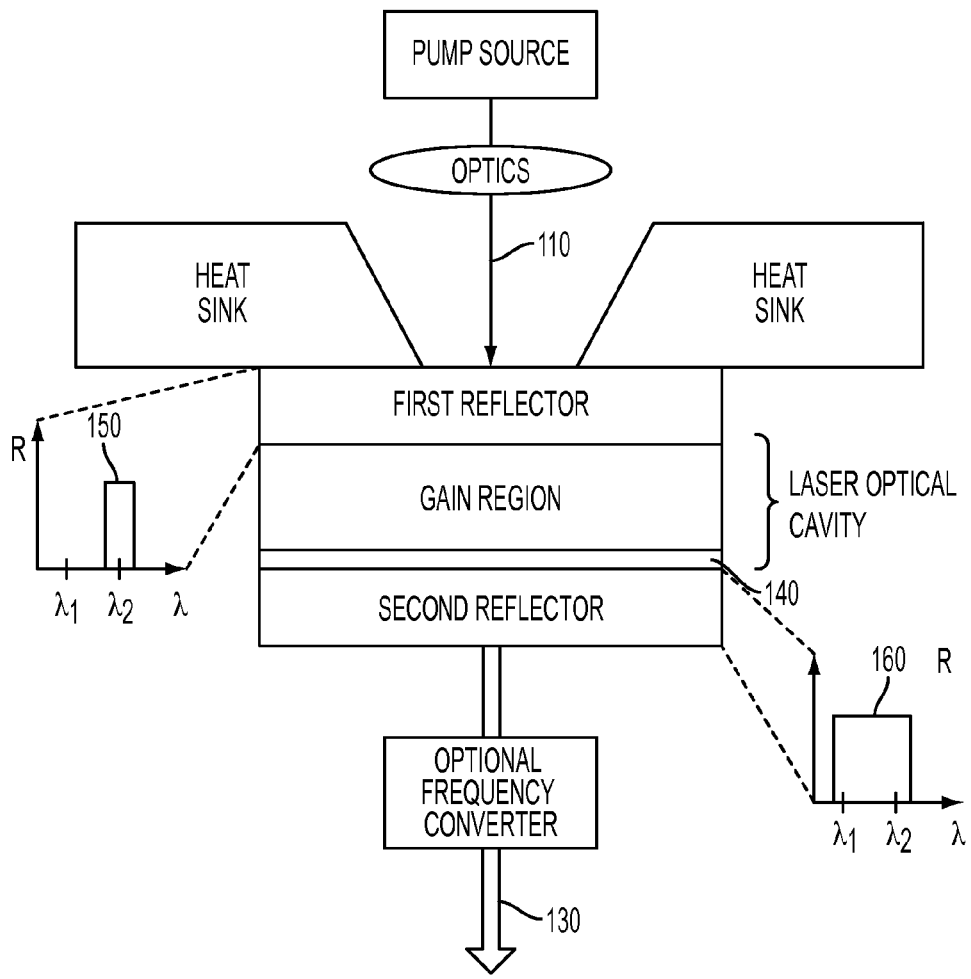
FIG. 1 is a diagram of an optically pumped vertical cavity surface emitting laser (VCSEL) which incorporates a high reflectivity/bandwidth limited (HR/BL) distributed Bragg reflector (DBR)

Vertical cavity surface emitting lasers (VCSELs) and vertical external cavity surface emitting lasers (VECSELS) (collectively denoted V(E)CSELs) are of interest due to the high quality of their spectral and spatial optical lasing characteristics. Realization of V(E)CSELs within the III-nitride material system for ultraviolet (UV), blue, and green emission is challenging. Embodiments discussed herein involve configurations based on III-nitride materials for that formation of a compact and low-cost V(E)CSEL systems emitting in the near UV to blue spectral region. In some cases, the V(E)CSEL systems may include frequency doubling elements to achieve wavelengths down to the UV-C range.

Embodiments discussed below involve novel distributed Bragg reflectors (DBRs) integrated into optically pumped laser systems. The DBRs discussed herein can be used with any type of semiconductor laser, e.g., edge emitters or surface emitters, they are particularly useful VCSEL or VECSEL designs. The DBR designs discussed herein provide high reflectivity for the desired V(E)CSEL laser wavelength and high transparency for compact and low-cost semiconductor pump sources. Some designs involve DBRs having high reflectivity and limited reflectivity bandwidth. For example some DBRs discussed below have reflectivity of greater than 90% in a reflectivity bandwidth of less than about 60 nm at the central laser wavelength. These DBRs have transmissivity of greater than about 50% at the central wavelength of the pump radiation. In some cases, the high reflectivity DBRs having reflectivity bandwidth that is limited to near the laser wavelength are fabricated using ¾-wavelength-thick DBR layers which decrease the reflectivity bandwidth of the DBR significantly, allowing freedom in selection of pump source. The use of a high reflectivity/bandwidth limited (HR/BL) DBR can be helpful, because these DBRs allow commercially available, high power semiconductor pump sources with set emission wavelengths to be incorporated into optically pumped laser systems.

In general, high quality mirrors are needed for the short gain medium of surface emitting lasers. The DBRs used for such devices can have reflectivity greater than 90% or greater than 95%, or even greater than 99% at the laser wavelength. Optical pumping of V(E)CSELs allows for increased flexibility in DBR materials because the DBR does not need to be electrically conductive and dielectric DBRs can be used. In addition, optical pumping can facilitate absorption of the pump radiation and creation of the electron and hole pairs predominantly in the gain region, e.g., quantum wells, which reduces the threshold conditions for lasing.

For implementation of optically pumped V(E)CSELs in a compact and low-priced system, the choice of the pump source is of interest. High optical output power (e.g., up to 1 Watt) optical pump sources are currently commercially available based on GaN-based semiconductor lasers in the wavelength regime of 405 nm and 445 nm. However, dielectric ¼ wavelength DBRs which provide high reflectivity with relatively few material layers are non-optimal for V(E)CSELs that use these pump sources because the ¼ wavelength DBRs have a relatively wide reflectivity bandwidth and thus are reflective at 405 nm and 445 nm wavelengths.

Although generally applicable to lasers based on various material systems, the examples discussed below involve the design of DBRs for V(E)CSELs based on III-nitride material systems emitting at ultraviolet (UV), blue, and green wavelengths. The proposed DBRs provide sufficient reflectivity for the desired V(E)CSEL laser wavelength and sufficient transparency for the pump sources. The constraints of high reflectivity, e.g., greater than 95% reflectivity, and limited reflectivity bandwidth at the laser wavelength in conjunction with sufficient transmissivity for the pump radiation wavelength can be achieved using various materials and layer thicknesses. In one implementation, a high reflectivity/bandwidth limited (HR/BL) DBR can be fabricated using ¾-wavelength-thick material layers which reduce the reflectivity bandwidth of the DBR significantly and allow freedom in the pump configuration design. For a ¾-wavelength DBR, the thickness of the $i^{th}$ DBR layer is given by the equation:

$$t_i = 3\lambda_l/4n(\lambda_l) \quad [1]$$

where, $\lambda_l$ is the central (peak) wavelength of the laser radiation and $n(\lambda_l)$ is the refractive index of the layer material at the wavelength of the laser radiation.

In some implementations, the materials used for the DBR layers are dielectric material combinations which have a relatively high refractive index contrast, such as $SiO_2$ and $TiO_2$. The use of these high refractive index contrast materials means that relatively few layers can be employed to achieve high reflectivity. It is also possible to use materials having a lower refractive index contrast, although more layers would need to be used to achieve high reflectivity. The materials of the DBR layers may include dielectric and/or semiconductor materials which may be epitaxially grown or non-epitaxially deposited.

FIG. 1 is a diagram of an optically pumped vertical cavity surface emitting laser (VCSEL) which incorporates an HR/BL DBR. The VCSEL and VECSEL devices discussed herein can be operated as continuous wave (cw) lasers. The VCSEL of FIG. 1 comprises an optical pump source, a first reflector which is the HR/BL DBR, a second reflector, and a semiconductor gain region. As indicated in FIG. 1, the laser optical cavity is bounded by the first and second reflectors. The gain region may comprise several quantum well (QW)

structures, and each QW structure may comprise one or more quantum wells. The gain region can be fabricated by epitaxially growing the semiconductor layers of the gain region on a substrate which is subsequently thinned to leave a substrate remnant 140. In some cases, the gain region may comprise 10 periods of InGaN double QWs deposited by metal-organic vapor phase epitaxy on a GaN substrate. The double QWs can be arranged in a resonant periodic gain scheme, so that the positions of the QWs align with the electric field pattern of the laser mode. The first reflector (HR/BL DBR) was deposited on the gain region. The GaN substrate was thinned and the second reflector was deposited directly on the backside of the gain region.

For example, the gain region may comprise multiple quantum well structures, such as about 10 periods of double quantum well structures based on InGaN, are grown on a substrate. Each quantum well structure may include in order the following layers: an InGaN pre-strain layer ($In_{0.03}Ga_{0.97}N$, 35.3 nm thick), a first thin spacer (GaN, 5 nm thick), a first quantum well, ($In_{0.18}Ga0.82N$, 3 nm thick), a second thin spacer (GaN, 5 nm thick), a second quantum well, ($In_{0.18}Ga0.82N$, 3 nm thick), a thick spacer (GaN, 21.7 nm thick), and a carrier confinement and strain management layer ($Al_{0.2}Ga_{0.8}N$, 20 nm thick). Additional structures and methods that can be used in connection with the approaches discussed herein are disclosed in commonly owned U.S. patent application Ser. No. 13/427,105, which is incorporated by reference herein in its entirety.

Figure 3:
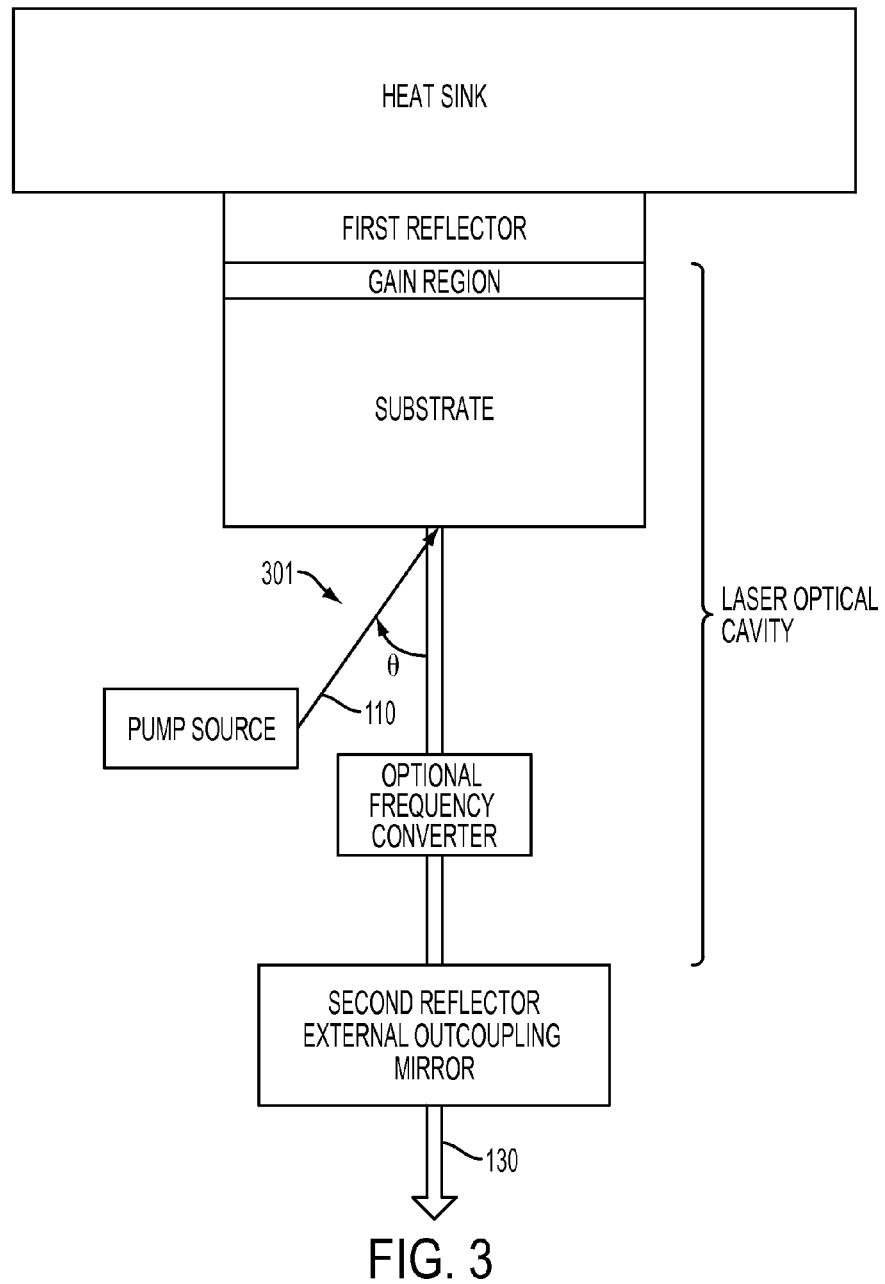
FIG. 3 is a diagram of an optically pumped vertical external cavity surface emitting laser (VECSEL) which incorporates a HR/BL DBR.

The pump radiation 110 passes through the first reflector and the gain region, generating electron-hole pairs in or near the quantum wells of the gain region. The electron-hole pairs diffuse to the quantum wells and recombine to create laser radiation. The laser radiation is reflected by the first and second reflectors within the laser optical cavity, creating a standing wave that provides resonant periodic gain. Laser radiation with sufficient energy passes through the second reflector indicated by arrow 130. Some implementations include an optional frequency converter, such as a nonlinear optical crystal that generates radiation at harmonics or at sum or difference frequencies of the laser radiation. Using the frequency converter, laser outputs in the deep UV spectrum, e.g., less than 280 nm, can be obtained. The optional frequency converter shown in FIG. 1 may be optionally used for all embodiments described herein. Frequency doubling can be more efficient when the frequency converter, e.g., non-linear crystal, is placed within the cavity of a VECSEL, as shown in FIG. 3.

In some embodiments, the pump source is a gallium nitride (GaN)-based laser diode (or, alternatively, a plurality of laser diodes) emitting in the range of 370-530 nm. For example, commercially available laser devices designed for Blu-ray digital players or projector displays emit at 405 nm or 445 nm. These devices are currently available and can be used as pump sources for GaN-based V(E)CSELs. The output power of these pump sources may be in the range of 0.5-10 Watts. As shown in FIG. 1, pump source optics can be configured to provide a focusing system of one or more lenses that focus the pump radiation to a pump beam spot size of 50-200 μm diameter, achieving a power density of more than 50 kW/cm². The gain region outputs a radiation beam at a desired wavelength, for example in the range of 420 nm-550 nm.

During operation, the gain region can become hot. To reduce the possibility of performance degradation or even damage to the device due to heat generation, the device may be mounted on a heat sink with the first reflector proximate the heat sink. The heat sink may, for example, be comprised of copper or other heat-conducting material such as diamond. An optional second heat sink may be disposed proximate the second reflector. As shown in FIG. 1, the heat sink has an opening to allow the pump radiation to access the first reflector and the gain region. Or alternatively, no opening in the heat sink is needed in cases where the heat sink is optically transparent for the pump wavelength, e.g., transparent diamond. If a second heat sink is used proximate the second reflector, the second heat sink also has an opening to allow emission of the laser radiation 130. In some configurations, these openings are centered above each other. As illustrated in FIG. 1, in some cases the pump radiation beam is incident on the first reflector normal to the surface of the first reflector. In this configuration, the pump source and semiconductor gain region may be co-axially aligned, enabling a linear arrangement of all optical parts of the structure, as illustrated in FIG. 1.

Figure 2:
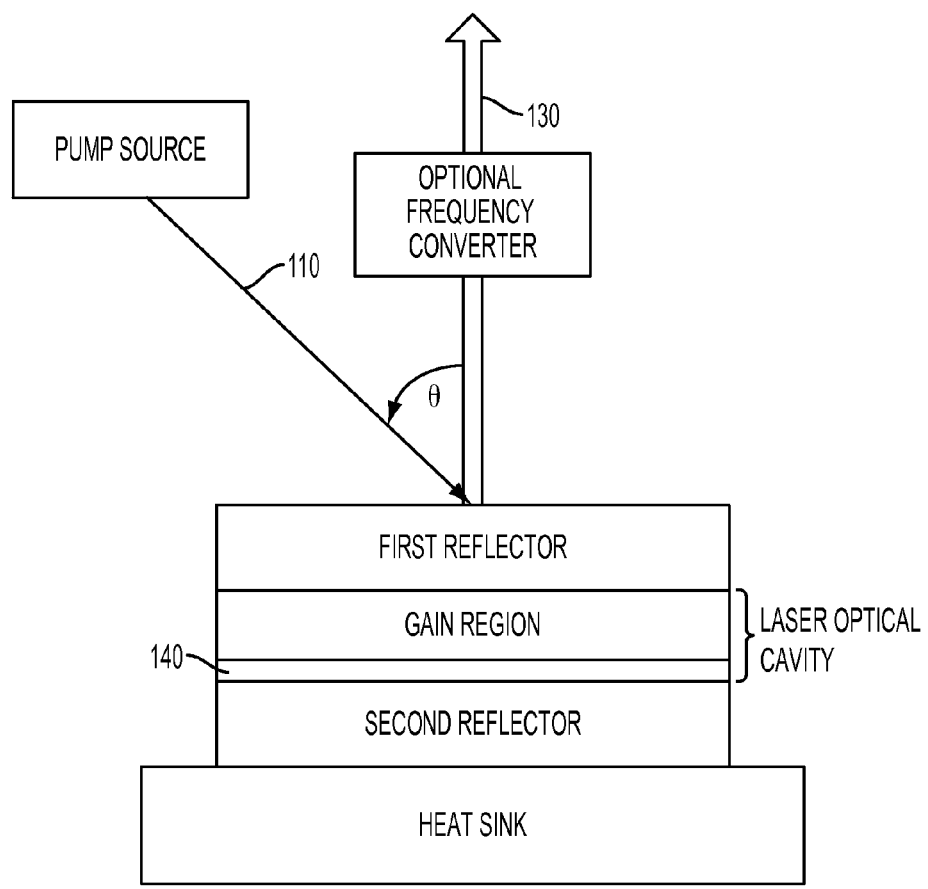
FIG. 2 illustrates a configuration for a VCSEL device wherein the pump source and the semiconductor structure are arranged so that the pump radiation beam is incident on the semiconductor structure at an angle, $\theta \neq 0$.

FIG. 2 illustrates another configuration for a VCSEL device wherein the pump source and gain region are arranged so that the pump source radiation 110 and the radiation 130 output from the gain region are not coaxial. In this arrangement, the pump radiation beam is incident on the semiconductor structure at an angle, θ≠0. Changing the incidence angle of the pump radiation beam for a given wavelength shifts the transmissivity/reflectivity characteristics of the first reflector as discussed in more detail below.

FIG. 3 depicts yet another possible configuration for a laser structure. In this example, the laser is arranged as a VECSEL. The implementation shown in FIG. 3 is similar in some respects to the VCSEL configuration shown in FIG. 2, except that the VECSEL includes an external cavity 301 that separates the second reflector, i.e., the external out coupling mirror, from the gain region. The external mirror may have a curved surface to adopt to the Gaussian beam profile of the laser mode. The long cavity (for example 50-200 mm) allows the insertion of additional optical components like non-linear crystals for second-harmonic generation or birefringent filters to fine-tune the laser emission wavelength. In some implementations, the VECSEL substrate upon which the gain region is grown may be retained providing structural support for the VECSEL. The substrate can have thickness sufficient to facilitate handling of the device or a thickness of about 100 μm, for example. In these implementations, the substrate material would be a large bandgap material, e.g., such as GaN, or other materials which have high transparency to both the pump radiation and the laser radiation. In the configuration shown in FIG. 3, the heat sink does not need an aperture because the device is pumped from the opposite side of the gain region.

As previously mentioned, the first reflector in FIGS. 1-4 comprises an HR/BL DBR which may be fabricated using a variety of materials and layer thicknesses. The materials of the DBR layers may include dielectric and/or semiconductor materials which may be epitaxially grown or non-epitaxially deposited. In some cases, the HR/BL DBR may include a number of layer pairs, wherein each layer has a thickness as set forth in Equation 1 above. The number of layer pairs used in the HR/BL DBR depends on the materials of the layers, however, for high refractive index materials, as few as 7 layer pairs may be used.

Figure 4:
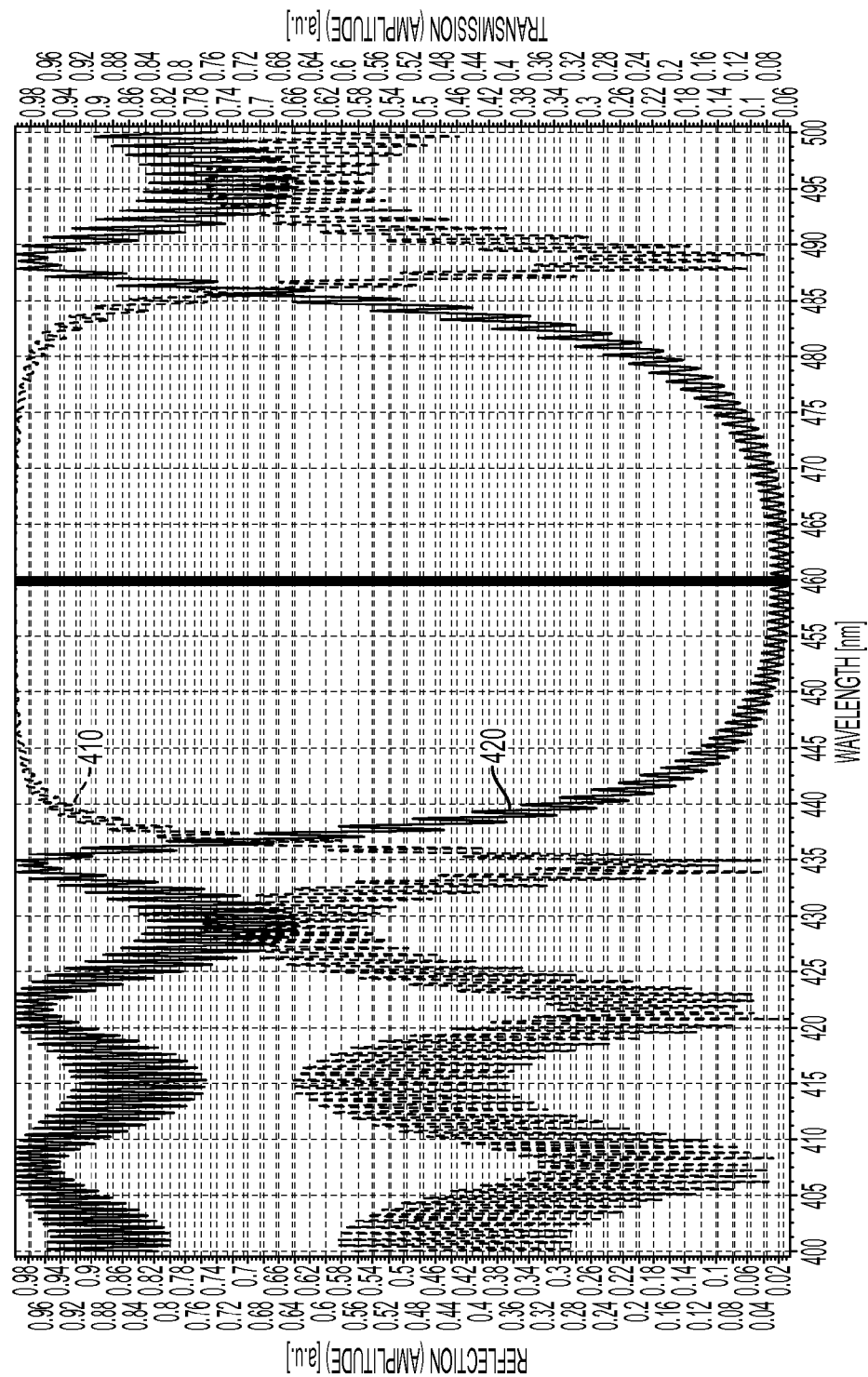
FIG. 4 shows simulation plots of the reflectivity and transmissivity with respect to incident radiation wavelength for an HR/BL DBR comprising 8 pairs of $SiO_2/TiO_2$ deposited on GaN and having ¾-wavelength layer thicknesses designed for a central wavelength of 460 nm.

FIG. 4 shows simulation plots of the reflectivity 410 and transmissivity 420 with respect to incident radiation wavelength for an HR/BL DBR comprising 8 pairs of $SiO_2/TiO_2$ deposited on GaN and having layer thicknesses designed for a center wavelength of 460 nm. In this example, assuming $n(\lambda_l)$=1.46 and 2.2 for $SiO_2$ and $TiO_2$, respectively, each of the $SiO_2$ layers has a thickness of $t_{SiO2}$=3×460 nm/4×1.46=236.30 nm and each of the $TiO_2$ layers has a thickness of $t_{TiO2}=3\times460$ nm/$4\times2.48=139.11$ nm. As can be seen from FIG. 4, high reflectivity (>99%) with a rather narrow bandwidth of about 55 nm can be realized in comparison to about 150 nm for a ¼ wavelength $SiO_2/TiO_2$ DBR. Furthermore, it can be observed from FIG. 4 that wavelengths outside of this high reflectivity band, e.g., wavelengths from about 400 nm to about 437 nm have transmissivity greater than about 50%. Several wavelength bands have transmissivity greater than 90%. For example, at normal incidence, pump radiation wavelengths of about 435 nm, 423 nm, and between 405-410 nm exhibit transmissivity greater than about 90%.

As previously mentioned, two wavelengths (405 nm and 445 nm) of high power InGaN laser diodes are commercially available with up to 1 Watt optical output power. Some examples provided below provide configurations applicable to these potential pump radiation wavelengths, although implementation of the approaches described herein is not limited to these particular pump radiation wavelengths.

Figure 5:
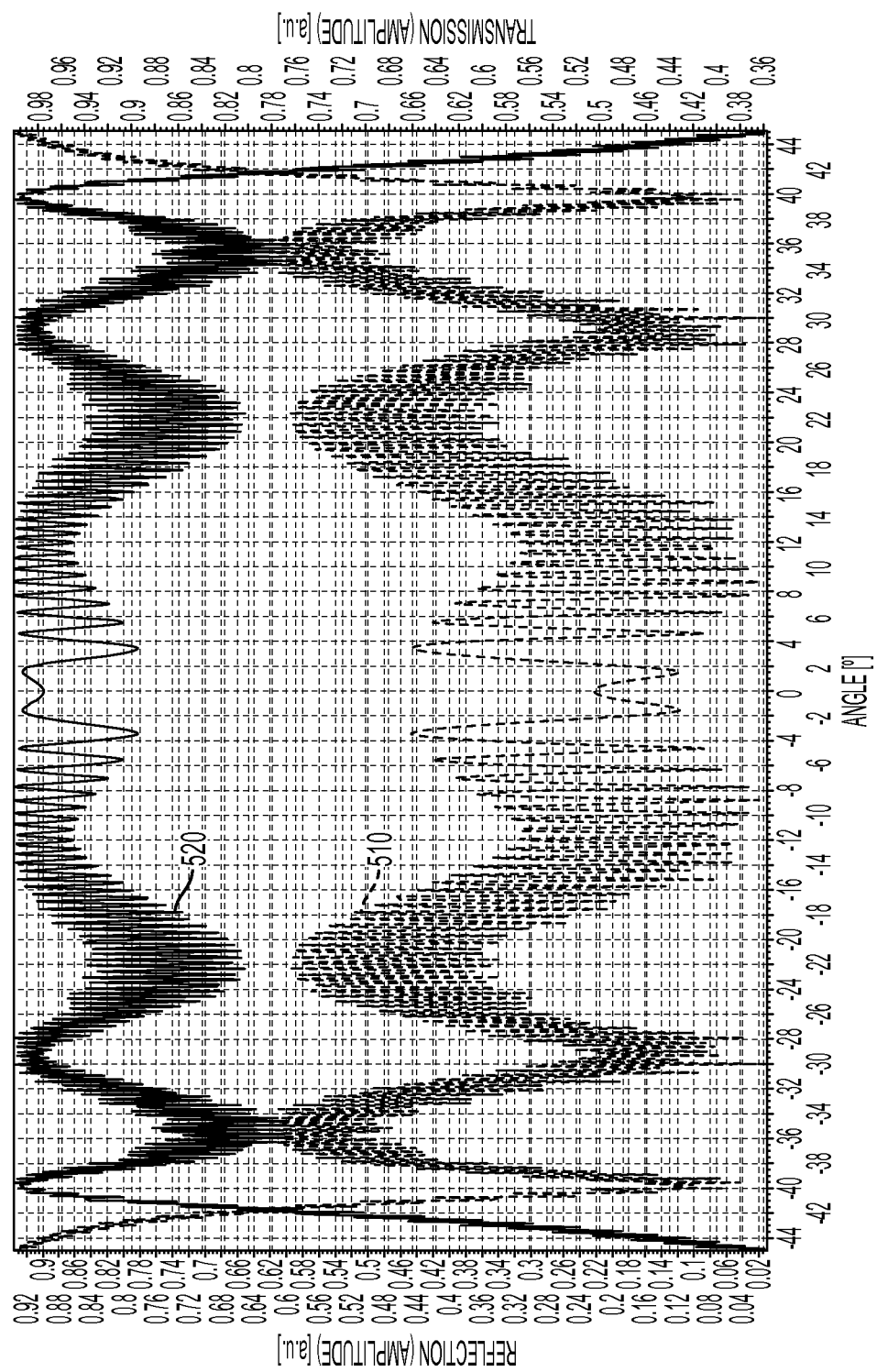
FIG. 5 shows simulated plots of the angle spectrum of the reflectivity and transmissivity for the ¾-wavelength HR/BL DBR having $SiO_2/TiO_2$ layers (as described in connection with FIG. 4) for a pump wavelength of 405 nm.
Figure 6:
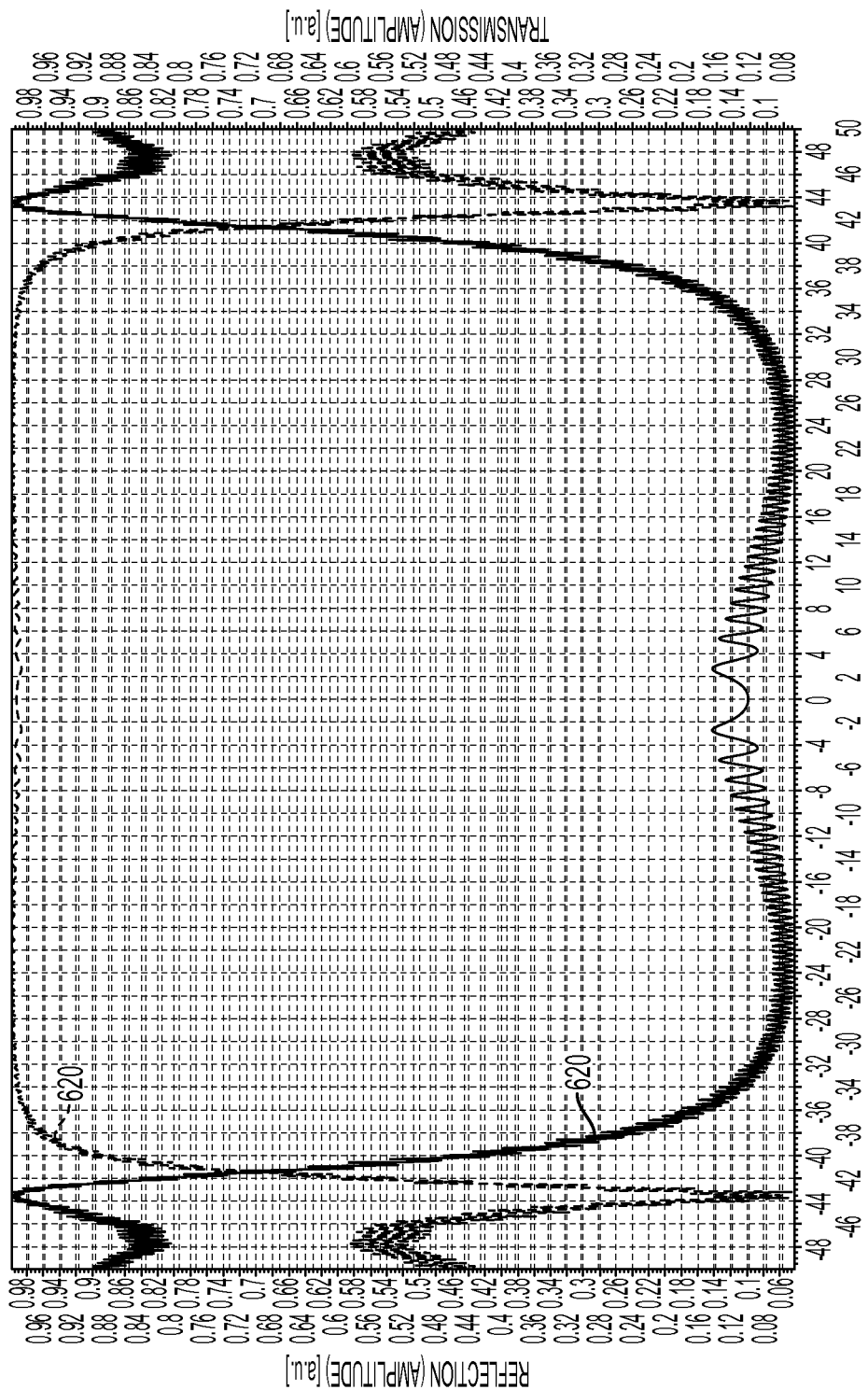
FIG. 6 shows simulated plots of the reflectivity and transmissivity for the ¾-wavelength HR/BL DBR having $SiO_2/TiO_2$ layers (as described in connection with FIG. 4) for a pump wavelength of 445 nm.

FIG. 5 shows simulated plots of the angle spectrum of the reflectivity 510 and transmissivity 520 for the ¾-wavelength HR/BL DBR having $SiO_2/TiO_2$ layers (as described in connection with FIG. 4) for a wavelength of 405 nm. It can be seen from FIG. 5 that for angles of 0-12, 29 and 40 degrees the DBR provides high transmissivity making these angles particularly suitable for pumping. FIG. 6 shows simulated plots of the reflectivity 610 and transmissivity 620 for the ¾-wavelength HR/BL DBR having $SiO_2/TiO_2$ layers (as described in connection with FIG. 4) for a wavelength of 445 nm. The angle spectrum of the ¾-wavelength HR/BL DBR demonstrates that pumping under an angle of 43 degrees provides high transmissivity at 445 nm.

Figure 7:
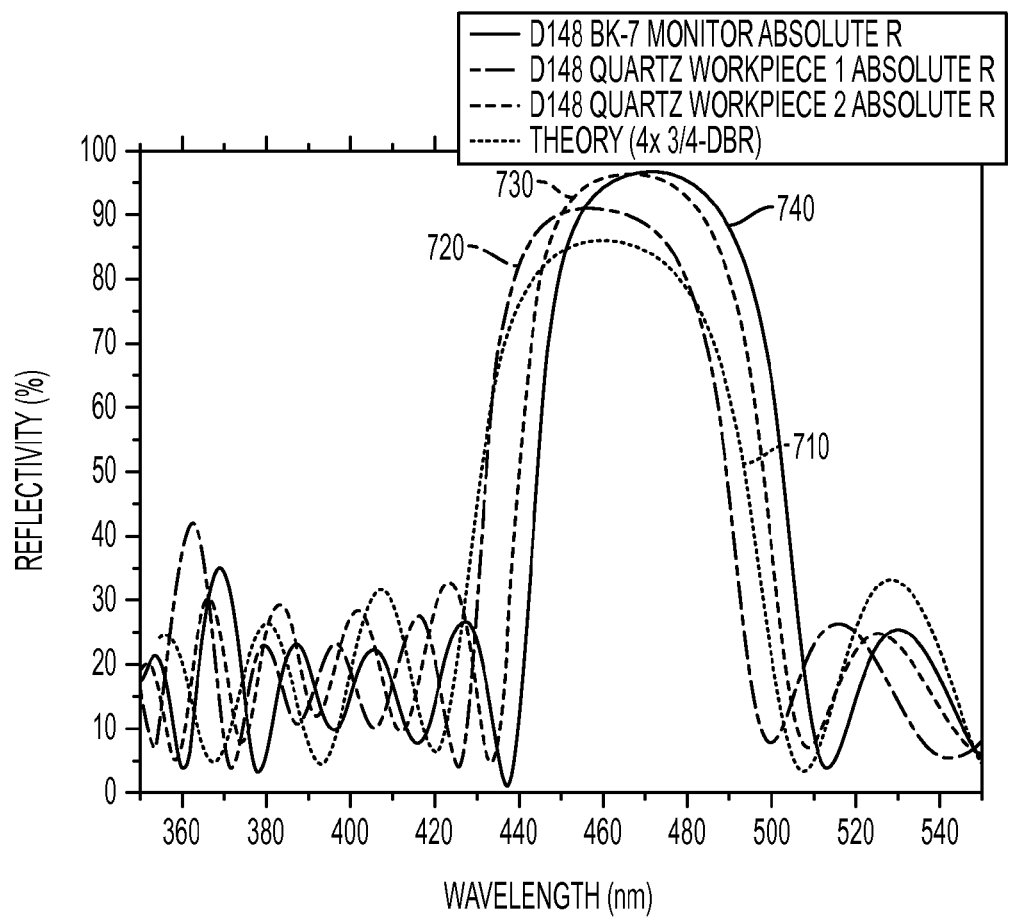
FIG. 7 compares predicted reflectivity with measured reflectivity of various experimental structures.

The simulated results were verified with experimental structures. Three quarter wavelength HR/BL DBRs were fabricated with target wavelengths of about 460 nm-470 nm. These experimental structures comprised ¾-wavelength DBRs having four layer pairs of $SiO_2/TiO_2$ deposited on quartz and BK7. The results of the experimental structures matched well to the theoretical prediction as can be seen in FIG. 7. In FIG. 7, line 710 shows the predicted reflectivity results, line 720 shows experimental reflectivity results from a first 4 layer pair DBR deposited on quartz, line 730 shows experimental reflectivity results from a second 4 layer pair DBR deposited on quartz, and line 740 shows experimental reflectivity results from a second 4 layer pair DBR deposited on BK7.

Figure 8:
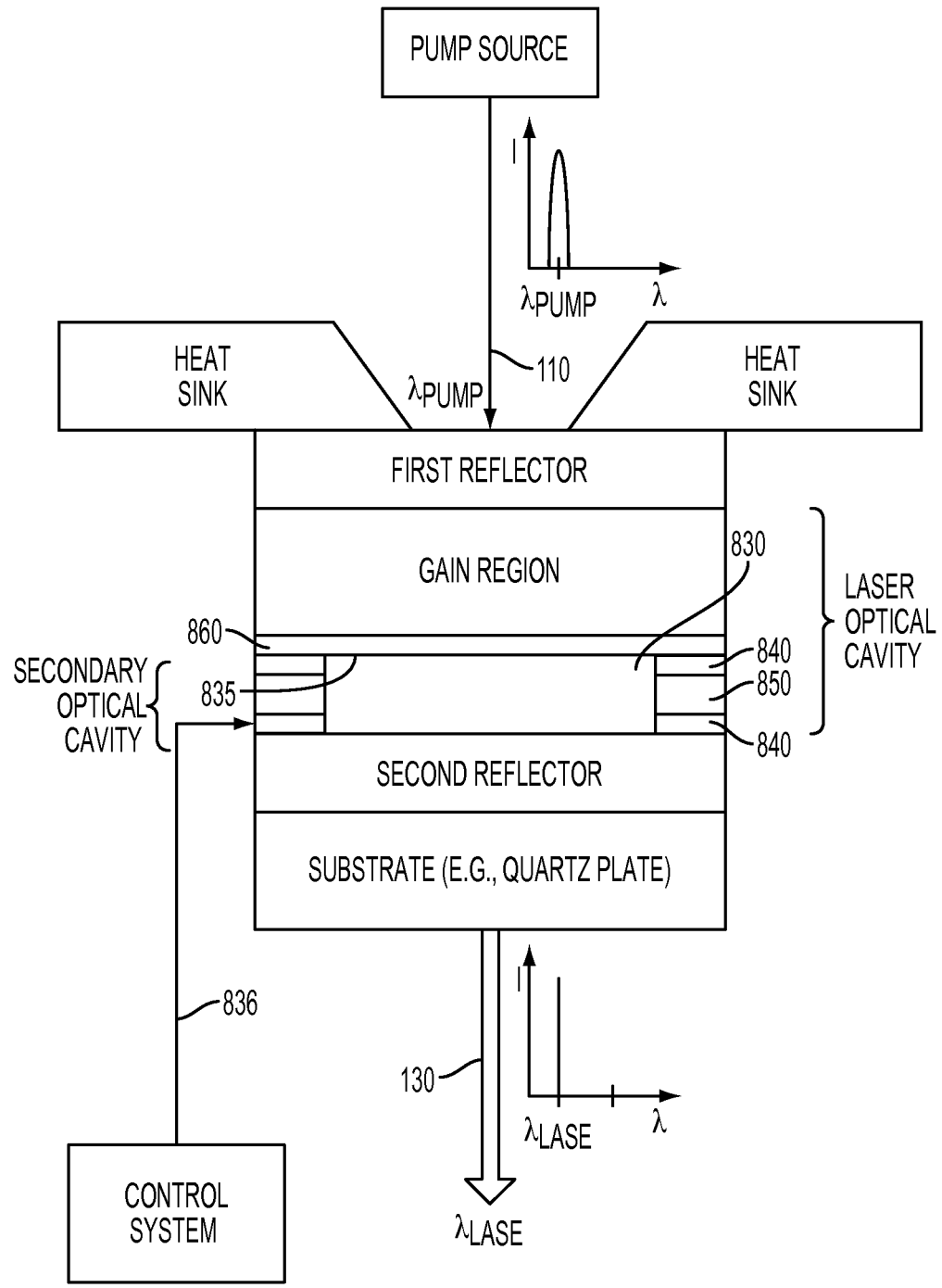
FIG. 8 is a diagram of a VECSEL that includes a small air gap between the gain region and reflector.

In some configurations, a small air gap between the second reflector and the gain region of a VECSEL structure, as illustrated in FIG. 8, may be used to enhance the spectral quality of a pump source. The VECSEL of FIG. 8 includes a first reflector. In general, the first reflector may comprise any type or reflector. In some implementations, the first reflector is an HR/BL DBR that has a relatively narrow reflectivity bandwidth centered at the laser radiation wavelength, $\lambda_{lase}$. The narrow reflectivity bandwidth of the HR/BL DBR does not significantly reflect radiation at the pump wavelength, $\lambda_{pump}$, allowing the device to be optically pumped by the pump source. The relatively narrow reflectivity (R) bandwidth of the HR/BL DBR allows the pump radiation to pass through the first reflector and to access the gain region, whereas the laser radiation generated in the gain region is reflected back to the laser optical cavity. For example, in embodiments that use a HR/BL DBR first reflector, the first reflector may comprise 8 pairs of $SiO_2/TiO_2$ with layer thicknesses of 236.30 nm for the $SiO_2$ layers and 139.11 nm or the $TiO_2$ layers.

In some implementations, the second reflector can have a relatively wide reflectivity bandwidth with high reflectivity of both the pump radiation wavelength, $\lambda_{pump}$, and the laser radiation wavelength $\lambda_{lase}$. For example, the second reflector may comprise a ¼-wavelength DBR with 6.5 layer pairs of $SiO_2/TiO_2$ with the $SiO_2$ layer having a refractive index, $n_{SiO2}$, of 1.47 and a thickness of 78 nm and the $TiO_2$ layers having a refractive index, $n_{TiO2}$, of 2.2 and a thickness of about 52 nm. This DBR has a reflectivity greater than about 99% in about a 150 nm bandwidth centered at a wavelength of 460 nm.

Providing a small air gap 830 within the resonator laser optical cavity can produce single mode emission of the VECSEL, with multimode pump radiation. This embodiment provides a practicable approach for improving the spectral quality of a pump source. The air gap 830 disposed between the second reflector and the gain region creates third reflecting surface 835 in the laser optical cavity at the interface between the air gap 839 and the gain region. The reflecting surface 835 and the second reflector define a secondary optical cavity, which has a shorter optical length than the laser optical cavity. The secondary optical cavity and the (primary) laser optical cavity form coupled resonators. The coupling between the primary and secondary optical cavities leads to certain output modes being more preferred than others. If a preferred mode overlaps with the gain spectrum, a single mode operation becomes possible (see, for example, the simulation shown below in FIG. 12). In some embodiments, the spacing between the reflecting surface 835 and the second reflector can be adjusted until the device outputs laser radiation having fewer output modes than the input modes of the pump source.

In some implementations, the air gap may be dynamically adjustable to provide one or more selected output modes, e.g., a single predominant output mode. The gain region and/or the second reflector may have electrodes 840 disposed on their inward surfaces facing each other with elastically deformable spacers 850 between the electrodes 840. Signals 836 can be provided to by a control system to electrodes 840 to cause changes in distances between the inward, reflective surfaces 835 and the second reflector, such as electrostatically, electromagnetically, or piezoelectrically, changing the shape of the region between them. The air gap spacing, or distance between the reflective surfaces forming the air gap, can have a wide range of values, e.g., on the order of about a micrometer to tens of millimeters. Larger air gaps allow the insertion of additional optical components into the air gap. For example, non-linear crystals for second-harmonic generation or birefringent filters to fine-tune the laser emission wavelength may be inserted into the air gap.

Figure 9:
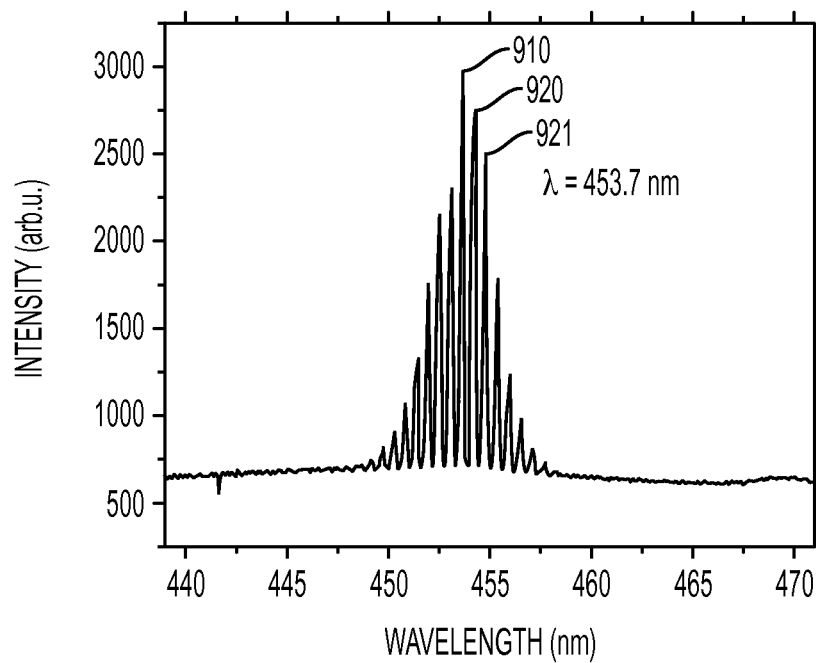
FIG. 9 shows the lasing spectrum lasing produced by a first experimental laser structure similar to the VCSEL shown in FIG. 2.
Figure 11:
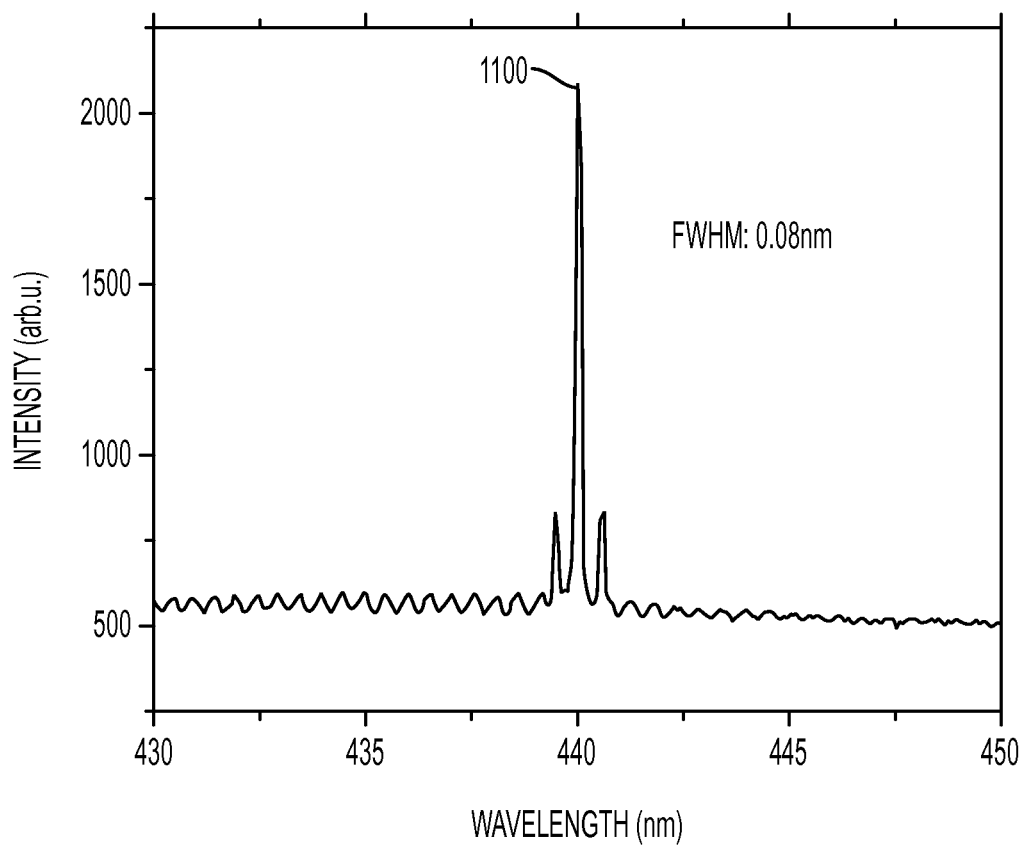
FIG. 11 demonstrates lasing produced by a second experimental laser structure similar to the VECSEL shown in FIG. 8, which included an air gap.

FIG. 9 shows the lasing spectrum lasing produced by a first experimental laser structure similar to the VCSEL shown in FIG. 2, which does not include an air gap. In the first experimental structure, the gain region (10 periods of InGaN double quantum wells arranged in a resonant periodic gain (RPG) scheme) was grown on a bulk GaN substrate. A ¼ wavelength $SiO_2/TiO_2$ DBR (first reflector) was deposited on the gain region. The GaN substrate was thinned by polishing to a thickness of less than 100 μm. The second reflector, comprising a ¼ wavelength $SiO_2/TiO_2$ DBR was deposited on the polished back side of the substrate. FIG. 11 demonstrates lasing produced by a second experimental laser structure similar to the VECSEL shown in FIG. 8, which included an air gap 830 of about 10 μm between the gain region and the second reflector. As previously mentioned, other air gap thicknesses could be used to achieve a similar result. For the second experimental structure, the both reflectors were ¼ wavelength $SiO_2/TiO_2$ DBRs. Both experimental structures were operated and pumped with a pulsed dye laser emitting at 384 nm with an angle of incidence of about 40 degrees.

In both first and second experimental devices, the material quality of the gain chips was confirmed by structural and optical characterization methods. High resolution x-ray diffraction measurements in combination with transmission electron microscopy investigations were used to determine optimal parameters for the structural properties. The growth process was controlled to create sharp layer interfaces and to avoid the development of extended defects like V-defects. The root mean square (rms) surface roughness of the epitaxial surface of the gain region was determined to 0.15 nm for a 2 µm×2 µm scan from atomic force microscopy (AFM). The internal quantum efficiency (IQE) of the samples was determined by temperature-dependent photoluminescence measurements. The IQE of the laser samples exceeded 50%.

FIG. 9 shows the laser emission spectrum of the first experimental structure with the emission having a central wavelength 910 of 453.7 nm. Multiple longitudinal modes 920, 921 are clearly visible. The line width of the laser modes is smaller than 0.1 nm. The mode spacing between the individual lasing modes correlates to the resonator (optical cavity) length, which in this case consists of the thicknesses of the thinned GaN substrate and the epitaxial layers. The thickness was determined to be about 73 µm.

Figure 10:
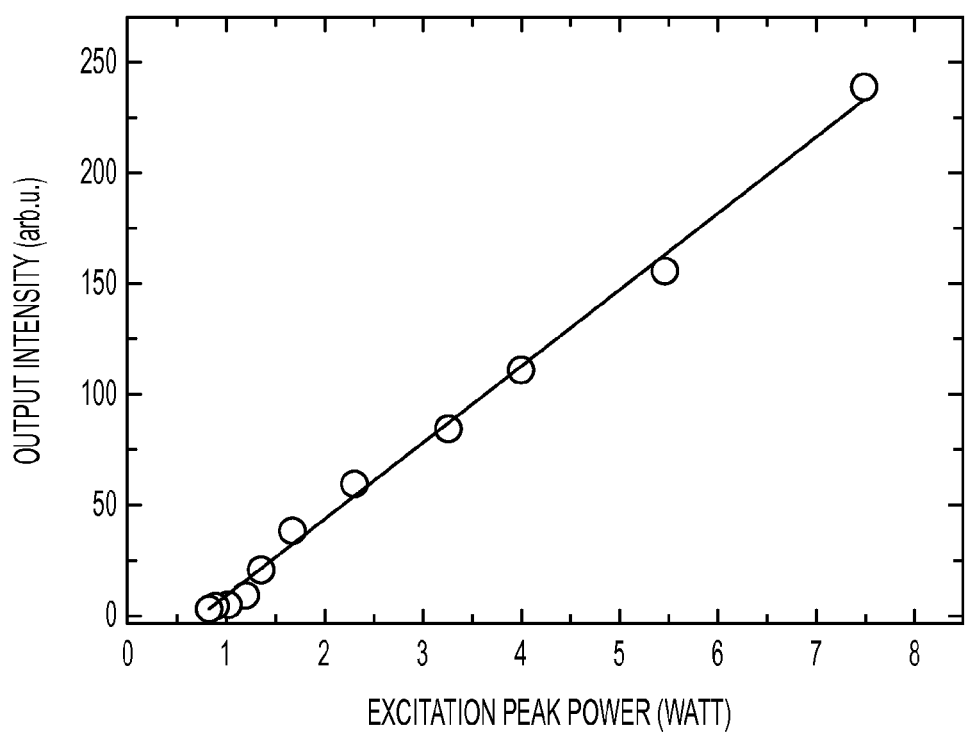
FIG. 10 shows the output power of the VCSEL of the first experimental laser structure.

FIG. 10 shows the output power of the VCSEL (first experimental structure) vs. the peak pump power of the dye laser at room temperature. The peak pump power was determined by measuring the averaged pump power incident on the sample and taking into account the pulse length and the repetition frequency of the pump laser. The threshold pump power can be determined to about 0.75 W. For an estimated pump spot diameter of about 30 µm, the threshold pump power was about 100 kW/cm².

FIG. 11 shows the lasing spectrum of the VECSEL with an air gap between the GaN chip and the DBR mirror (second experimental structure). As evident from FIG. 10, the optical properties of the laser emission changed significantly. Whereas multiple longitudinal modes were recorded for the first experimental laser structure without air gap, the spectrum of the second experimental laser structure with the air gap shows a single dominant longitudinal mode 1100. In addition, the lasing wavelength has shifted to 440 nm. Both features can be explained by considering the additional interface 835 between semiconductor and air.

Figure 12:
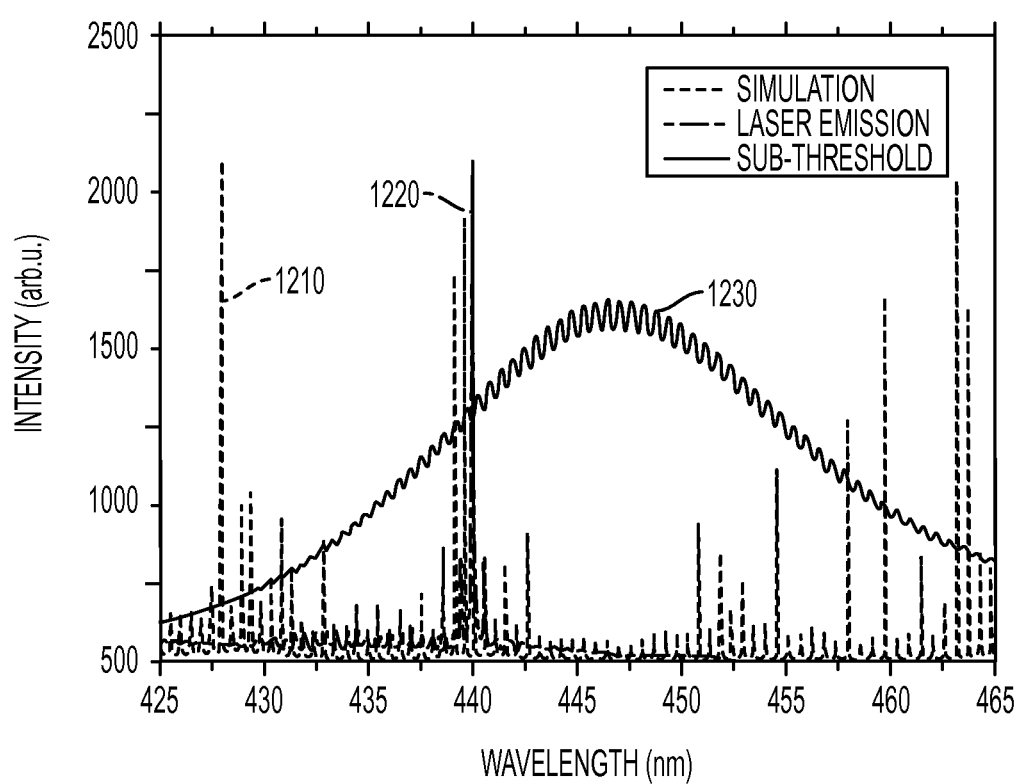
FIG. 12 shows a simulation of the cavity modes of a system which includes the moveable external mirror, the air gap, the thinned GaN remnant, and the epitaxial side DBR.

FIG. 12 shows a simulation of the cavity modes 1210 of the system, which comprises the moveable external mirror, the air gap, the thinned GaN remnant, and the epitaxial side DBR. The lasing wavelength 1220 coincides with one of these modes. For comparison, the photoluminescence spectrum 1230 of the sample without second DBR under the same excitation conditions as used for the laser operation is also shown. As evident in FIG. 12, the cavity determines the lasing wavelength, which does not necessarily coincide with the peak photoluminescence emission wavelength of the QWs.

Incident pump photons have higher energy than the laser photons and the pump-laser photon energy difference is denoted the quantum defect. The pump-laser photon energy difference is dissipated as heat from the device active region. Additionally, heat generation occurs from the non-ideal material quality in the form of non-radiative recombination. Dielectric reflectors can use high refractive index contrast materials which provide very good reflectivity with relatively few layers. However, dielectrics may exhibit relatively low thermal conductivity, and, when disposed between the gain region and the heat sink, reflectors made of these dielectric materials can impede heat transfer from the gain region to the heat sink. In some embodiments, laser structures may include reflectors that have thermal conductivity that varies with respect to distance from the gain region. For example, the thermal conductivity of the reflector may have thermal conductivity that varies with respect to distance. For example, the thermal conductivity, $k_1$, in a first region of the reflector may be different from the thermal conductivity, $k_2$, in a second region of the reflector. Such reflectors may be better suited to achieve dual design constraints of acceptably high reflectivity, which can be accomplished using high refractive index contrast dielectrics, and acceptably high thermal conductivity, which may be accomplished using semiconductor materials that have a higher thermal conductivity than the thermal conductivity of dielectric materials.

Figure 13:
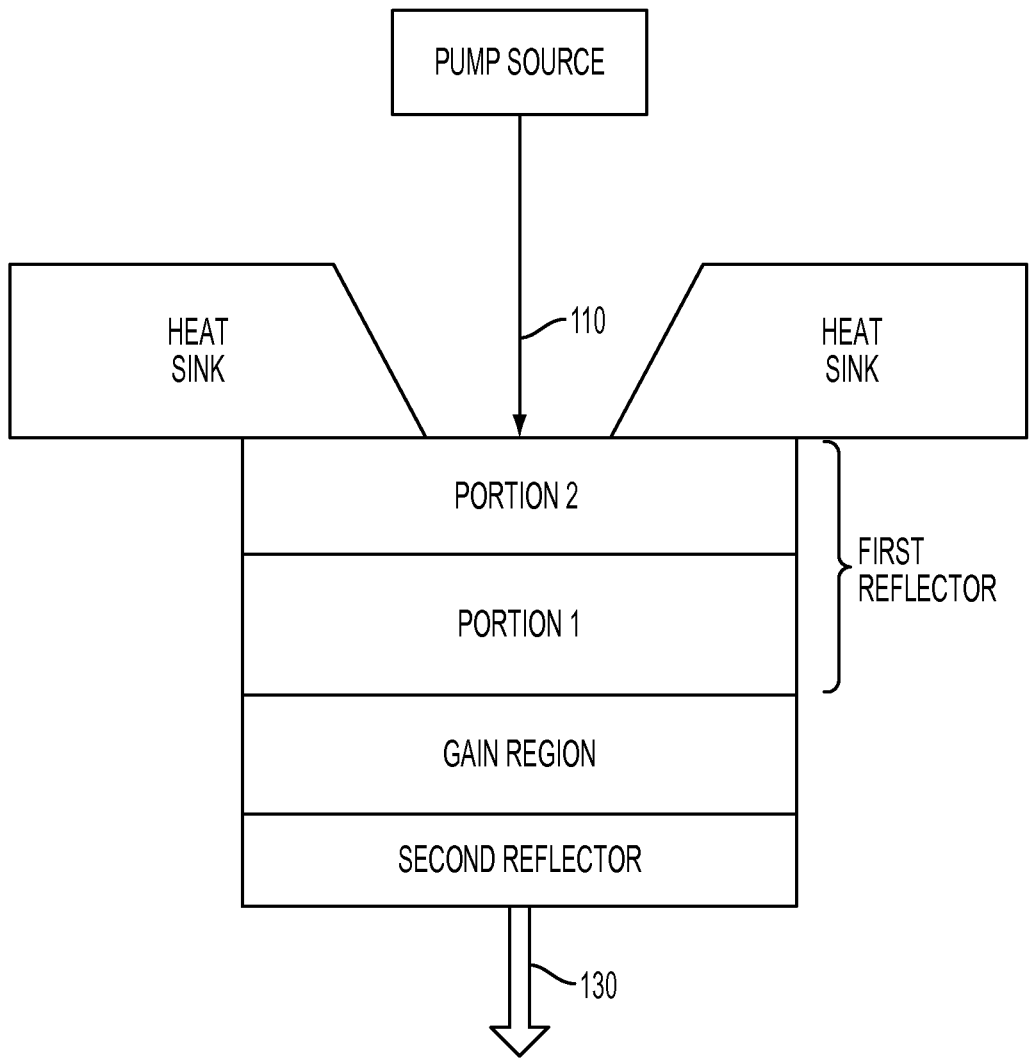
FIG. 13 depicts a VCSEL that includes first and second reflectors disposed on either side of a gain region, where the first reflector has a first portion and a second portion, and the thermal conductivity of the first portion is different from the thermal conductivity of the second portion.

FIG. 13 depicts a VCSEL that includes first and second reflectors disposed on either side of a gain region. In this example, the first reflector is proximate a heat sink and includes first and second portions (denoted portion 1 and portion 2, respectively in FIG. 13). The first portion has a thermal conductivity that is different from the thermal conductivity of the second portion.

In some implementations, the first portion may be made of semiconductor materials that have a relatively higher thermal conductivity. For example, the first portion of the first reflector may comprise a semiconductor material which is epitaxially grown on the gain region. The second portion may be made of dielectric materials that have a relatively lower thermal conductivity than the semiconductor material. The second portion of the first reflector may be deposited on the first portion of the first reflector, e.g., by sputtering or evaporation processes.

In some cases, the first portion may be an epitaxially grown semiconductor DBR portion, comprising a number layer pairs of GaN/AlGaN (thermal conductivity about $k_{semi}$=1.3 W/cm-K), or other suitable semiconductor material. The second portion may be a non-epitaxial, dielectric DBR portion, e.g., comprising layer pairs of SiO$_2$/TiO$_2$ (thermal conductivity about $k_{diel}$=0.04 W/cm-K). For example in some implementations, the first portion may comprise 10.5 layers pairs of GaN/Al$_{0.2}$Ga$_{0.8}$N, where the GaN layers have a thickness of about 46.8 nm and the AlGaN layers have a thickness of about 48.8 nm. The second portion may comprise 4 layer pairs of SiO$_2$/TiO$_2$, wherein the SiO$_2$ layers have a thickness of about 78.8 nm and the TiO$_2$ layers have a thickness of about 53.2 nm.

If the higher thermal conductivity material, e.g., semiconductor, is used in conjunction with a lower conductivity material, e.g., dielectric, the total thickness of the dielectric portion which reduces the overall thermal resistance of the device. In some embodiments, one or both of the first portion or the second portion may be a HR/BL DBR. The first portion of the HR/BL DBR may be formed of ¼-wavelength GaN/AlGaN pairs and the second portion of the HR/BL DBR may be formed of ¾ wavelength SiO$_2$/TiO$_2$ layer pairs.

A number of values and ranges are provided in various aspects of the implementations described. These values and ranges are to be treated as examples only, and are not intended to limit the scope of the claims. For example, embodiments described in this disclosure can be practiced throughout the disclosed numerical ranges. In addition, a number of materials are identified as suitable for various facets of the implementations. These materials are to be treated as exemplary, and are not intended to limit the scope of the claims.

The foregoing description of various embodiments has been presented for the purposes of illustration and description and not limitation. The embodiments disclosed are not intended to be exhaustive or to limit the possible implementations to the embodiments disclosed. Many modifications and variations are possible in view of the above teaching.

The invention claimed is:

1. A laser structure, comprising:
a vertical cavity surface emitting laser structure, comprising:
   a GaN substrate;
   a group III-Nitride semiconductor gain region disposed on the GaN substrate and configured to emit laser radiation at a central laser wavelength, $\lambda_l$, having a range between about 370 nm to about 550 nm;
   a pump source configured to emit a pump radiation beam at a central pump wavelength having a range between about 350 nm to about 530 nm directed toward the gain region;
   a first reflector comprising a distributed Bragg reflector (DBR) disposed in the pump radiation beam, the first reflector having a relatively narrow reflectivity bandwidth for the laser radiation with reflectivity greater than about 90% across a bandwidth of about 60 nm centered at the central laser wavelength, the first reflector also having a reflectivity less than about 50% at the central pump wavelength, the first reflector having alternating layers, the $i^{th}$ layer of the first reflector having a thickness $t_{1i}=3\lambda_l/4\ \eta_{1i}(\lambda_l)$, where $\eta_{1i}(\lambda_l)$ is a refractive index of the ith layer of the first reflector at $\lambda_l$; and
   a second reflector comprising a DBR, the second reflector having alternating layers, the $i^{th}$ layer of the second reflector having a thickness $t_{2i}=\lambda_l/4\ \eta_{2i}(\lambda_l)$, where $\eta_{2i}(\lambda_l)$ is a refractive index of the $i^{th}$ layer of the second reflector at $\lambda_l$, the second reflector having a relatively wide reflectivity bandwidth with reflectivity greater than about 90% for both the laser radiation and the pump radiation, wherein the gain region is disposed between the first reflector and the second reflector.

2. The laser structure of claim 1, wherein the first reflector comprises more than about 6 alternating layer pairs.

3. The laser structure of claim 1, wherein the first reflector comprises alternating layers of non-epitaxial, dielectric materials.

4. The laser structure of claim 1, wherein the first reflector comprises alternating layers of epitaxially grown semiconductor materials.

5. The laser structure of claim 1, wherein the first reflector comprises:
   a first portion having a first thermal conductivity; and
   a second portion having a second thermal conductivity that is less than the first thermal conductivity.

6. The laser structure of claim 5, wherein:
   the first portion comprises alternating layers of epitaxially grown semiconductor materials; and
   the second portion comprises alternating layers of non-epitaxial, dielectric materials.

7. The laser structure of claim 1, wherein the pump radiation beam is incident on a surface of the first reflector at an angle with respect to normal to the surface of the first reflector.

8. The laser structure of claim 7, wherein the angle is about 25 to about 30 degrees or about 35 to about 40 degrees and the first reflector has reflectivity less than about 25% at the pump wavelength of about 405 nm.

9. The laser structure of claim 7, wherein the pump radiation beam is incident on the first reflector at an angle of about 43 degrees and the first reflector has reflectivity less than about 25% at the pump wavelength of about 445 nm.

10. The laser structure of claim 1, wherein the laser gain region comprises InGaN quantum well layers.

11. A laser structure, comprising:
a vertical surface emitting laser structure, comprising:
   a GaN substrate;
   a group III-Nitride semiconductor gain region configured to emit laser radiation at a central laser wavelength $\lambda_l$;
   a pump source configured to emit a pump radiation beam at a central pump wavelength directed toward the gain region;
   a heat sink;
   a first reflector comprising a distributed Bragg reflector (DBR) disposed proximate the heat sink, the first reflector having a relatively narrow reflectivity bandwidth for the laser radiation, the first reflector comprising:
      a first portion proximate to the semiconductor gain region and comprising first layers of a first semiconductor material alternating with second layers of a second semiconductor material, the first layer having an index of refraction $\eta_{s1}(\lambda_l)$ and a thickness $t_{s1}=\lambda_l/4(\lambda_l)$ and the second layer having an index of refraction $\eta_{s2}(\lambda_l)$ and a thickness $t_{s2}=\lambda_l/4\ \eta_{s2}(\lambda_l)$; and
      a second portion proximate to the heat sink and comprising first layers of a first dielectric material alternating with second layers of a second dielectric material, the first layer having an index of refraction $\eta_{d1}(\lambda_l)$ and a thickness $t_{d1}=3\lambda_l/4\ \eta_{d1}(\lambda_l)$ and the second layer having an index of refraction $\eta_{d2}(\lambda_l)$ and a thickness $t_{d2}=3\lambda_l/4\ \eta_{d2}(\lambda_l)$, the first portion of the first reflector having a thermal conductivity that is greater than a thermal conductivity of the second portion of the first reflector; and
   a second reflector having a relatively wide reflectivity bandwidth with reflectivity greater than about 90% for both the laser radiation and the pump radiation, wherein the gain region is disposed between the first reflector and the second reflector, wherein a first portion of the first reflector has a first thermal conductivity and a second portion of the first reflector has a second thermal conductivity that is lower than the thermal conductivity of the first portion, wherein the first portion is closer to the gain region than the second portion.

12. A semiconductor laser structure, comprising:
a vertical surface emitting layer structure, comprising:
a group III-Nitride semiconductor gain region having a first side and a second side and configured to emit radiation at a central laser wavelength;
a pump source configured to emit a pump radiation beam at a central pump wavelength directed toward the gain region;
a first reflector comprising a distributed Bragg reflector (DBR) arranged proximate the first side of the gain region and in the pump radiation beam;
a GaN substrate remnant upon which the semiconductor gain region is disposed, the substrate remnant including a reflecting surface;
a second reflector; and
an air gap between the second reflector and the reflecting surface.

13. The semiconductor laser structure of claim 12, wherein:
the first reflector having reflectivity greater than about 90% across a bandwidth of less than about 60 nm centered at the central laser wavelength, the first reflector also having a reflectivity less than about 50% at the central peak pump wavelength.

14. The laser structure of claim 12, further comprising positioning elements configured to adjust a thickness of the air gap.

15. The laser structure of claim 12, wherein the pump radiation beam comprises multiple modes and the laser radiation comprises a single mode.

16. The laser structure of claim 12, wherein the second reflector is disposed on a substrate that is substantially transparent to radiation at the central laser wavelength.

17. A method, comprising:
operating a vertical cavity surface emitting laser comprising;
a group III-Nitride semiconductor gain region configured to emit radiation at a central laser wavelength, first and second reflectors, and
a GaN substrate remnant upon which the semiconductor gain region is disposed, the substrate remnant having a reflecting surface, the first and second reflectors defining a primary laser cavity and the reflecting surface and the second reflector defining a secondary optical cavity;
operating a pump source configured to emit pump radiation having a number of input modes, the pump radiation directed toward and at least partially absorbed in the semiconductor gain region; and
adjusting a gap between the reflecting surface and the second reflector until the laser outputs a number of output modes that is less than the number of input modes.

18. The method of claim 17, wherein the number of output modes is only one.

19. The method of claim 17, wherein adjusting the gap comprises increasing or decreasing a length of a secondary cavity until the laser outputs one or more selected output modes.

20. The laser structure of claim 1, further comprising a substrate disposed between the first reflector and the second reflector.

21. The device of claim 1, wherein the bandwidth of the second reflector is about 150 nm.

22. The device of claim 11, wherein the bandwidth of the second reflector is about 150 nm.

* * * * *